United States Patent
Torin

(10) Patent No.: US 7,697,634 B2
(45) Date of Patent: Apr. 13, 2010

(54) INTERPOLATION OF COMPLEX SIGNALS

(75) Inventor: Shigetsune Torin, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 796 days.

(21) Appl. No.: 11/510,081

(22) Filed: Aug. 25, 2006

(65) Prior Publication Data

US 2008/0049879 A1 Feb. 28, 2008

(51) Int. Cl.
*H03K 9/00* (2006.01)

(52) U.S. Cl. ....................................... 375/316
(58) Field of Classification Search ................. 375/316, 375/326, 327, 346
See application file for complete search history.

(56) References Cited

U.S. PATENT DOCUMENTS

| | | | | |
|---|---|---|---|---|
| 6,628,707 | B2 * | 9/2003 | Rafie et al. | 375/233 |
| 7,010,062 | B2 * | 3/2006 | Joshi et al. | 375/326 |
| 7,342,980 | B2 * | 3/2008 | Nair | 375/326 |
| 2001/0046847 | A1 | 11/2001 | Wakamatsu et al. | |
| 2004/0120304 | A1 | 6/2004 | Kloos et al. | |

OTHER PUBLICATIONS

DM1010 DTV Measurement Demodulator, [Online] Jul. 13, 2006, XP002461798 Retrieved from the Internet: URL: www.ztechnology.com>.

* cited by examiner

*Primary Examiner*—Don N Vo
(74) *Attorney, Agent, or Firm*—Michael A. Nelson

(57) ABSTRACT

An improved interpolation technique for reconstructing a complex signal from sampled data estimates a carrier phase for each sampled data time. The carrier phase is then used to compensate for frequency variation in the complex signal. The complex components of the sampled data are then interpolated separately with the interpolated results being used to produce an interpolated magnitude that is the reconstructed complex signal.

6 Claims, 5 Drawing Sheets

INTERPOLATION OF COMPLEX SIGNALS

BACKGROUND OF THE INVENTION

The present invention relates to the display of electrical signals, and more particularly to an improved interpolation of sampled complex signals for increasing the accuracy of the displayed signal.

There are many demands for observing the envelope magnitude of a radio frequency (RF) band-limited signal in the time domain. Modern measurement instruments, such as spectrum analyzers as represented in FIG. 1, measure the magnitude of the RF band-limited signal from the sampled signal. To measure intermediate points between the sampled points of the signal, some interpolation is commonly used. Ideal interpolation is reconstructing intermediate points from the discrete samples. One of the optimal methods for band-limited signals is resampling. However a traditional interpolation technique, such as a cubic spline interpolation, is still popular although the signal reconstruction is not perfect. A traditional interpolation technique may be more desirable when interpolation points are irregularly spaced, when faster speed is required, and/or when it is difficult to design a reconstruction filter for the resampling method.

There are two common methods for computing the magnitude of interpolated complex signals using traditional techniques. However both methods have some difficulties. One method is to take the magnitude of the original sampled signal and then apply interpolation, as shown in FIG. 2. This first method may produce negative interpolated data, as shown in FIG. 3. The other method is to apply interpolation separately to In-phase and Quadrature-phase components of the signal and then compute the magnitude, as shown in FIG. 4. This second method does not produce negative magnitudes, but may introduce excessive ripple if the signal phase is rotating, as shown in FIG. 5. If linear interpolation is used for the phase rotating signal, the cause of the introduced ripple in the magnitude trace is apparent, as shown in FIG. 6.

What is desired is an improved interpolation for complex signals that does not produce negative magnitudes and does not introduce excessive ripple in order to provide a more accurate representation of the input signal.

BRIEF SUMMARY OF THE INVENTION

Accordingly the present invention provides an improved interpolation scheme for reconstructing a complex signal from sampled data by estimating a carrier phase for each sampled data time. The carrier phase is then used to compensate for frequency variation in the complex signal. The complex components of the sampled data are then interpolated separately with the interpolated results being used to produce an interpolated magnitude that is the reconstructed complex signal.

The objects, advantages and other novel features of the present invention are apparent from the following detailed description when read in conjunction with the appended claims and attached drawing.

DETAILED DESCRIPTION OF THE INVENTION

Figure 1:
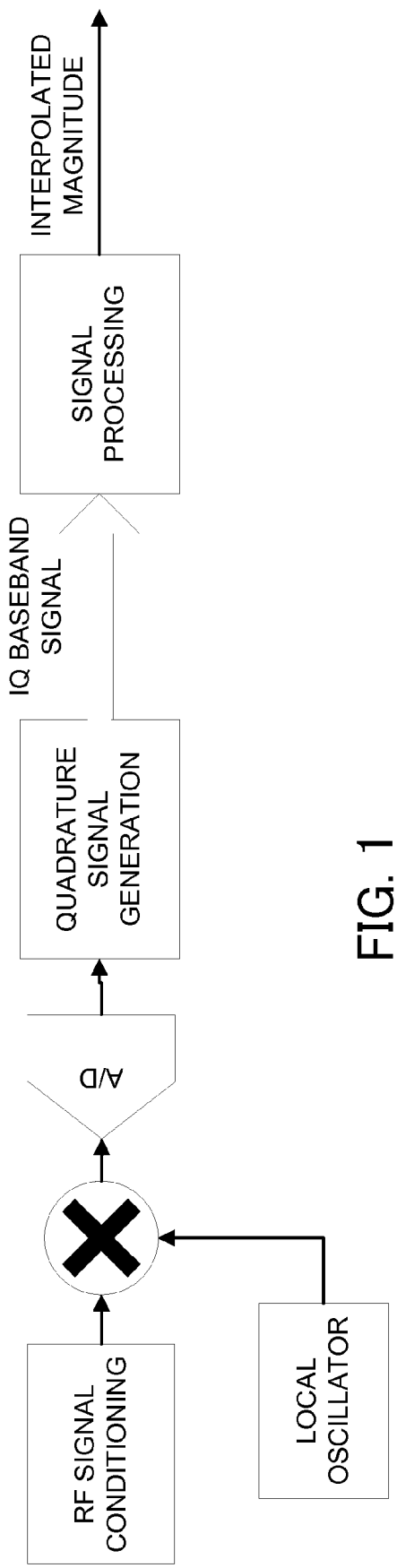
FIG. 1 is a block diagram view of a typical receiver for processing an RF signal for display.
Figure 2:
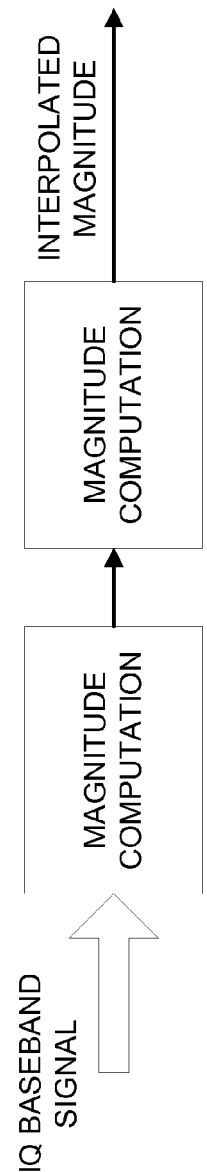
FIG. 2 is a block diagram view of a prior art interpolation technique used in the typical receiver of FIG. 1.
Figure 3:
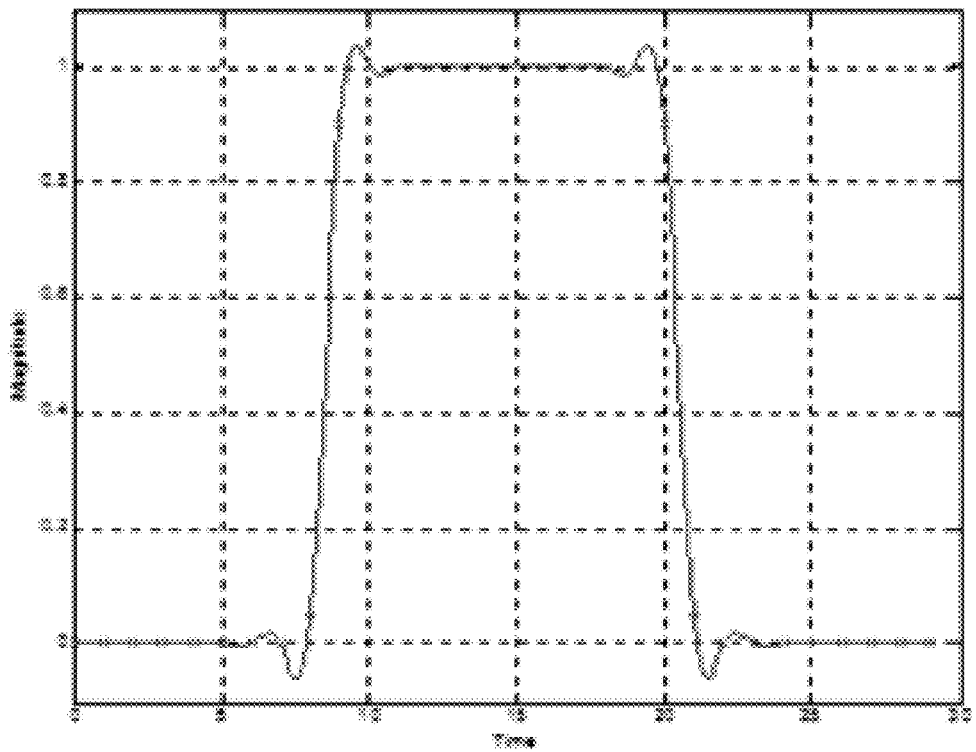
FIG. 3 is a graphic view of a pulsed continuous wave (CW) signal indicating a problem with the interpolation technique of FIG. 2.
Figure 4:
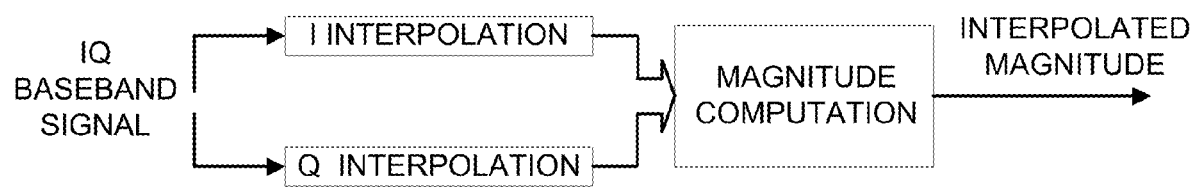
FIG. 4 is a block diagram view of another prior art interpolation technique used in the typical receiver of FIG. 1.
Figure 5:
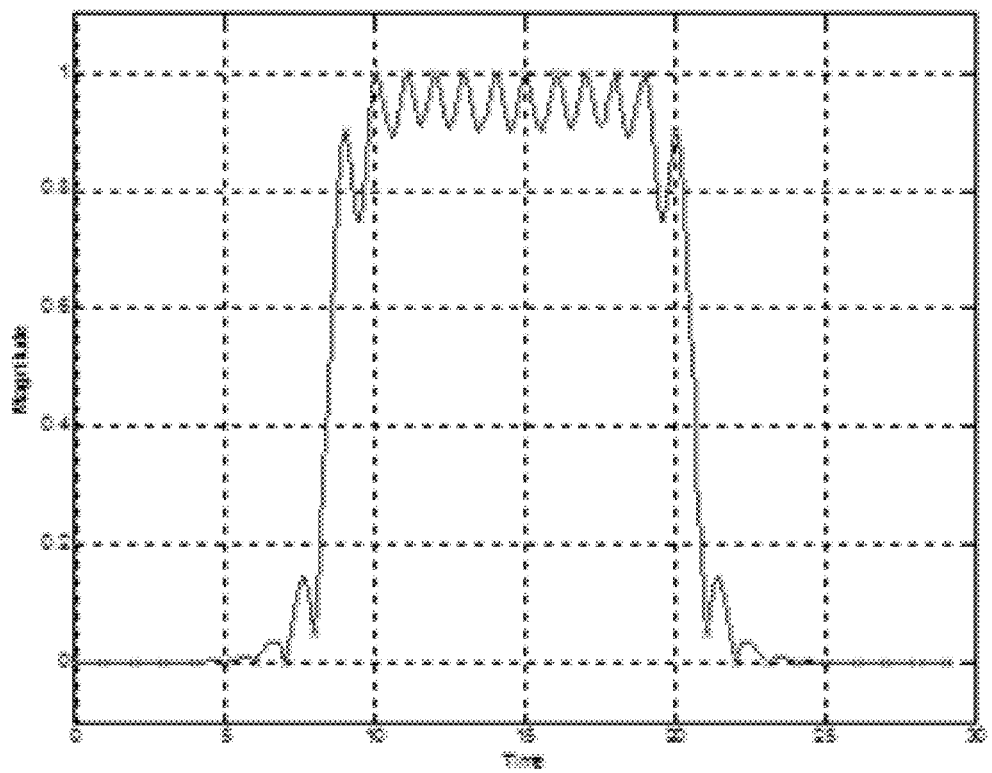
FIG. 5 is a graphic view of a pulsed CW signal indicating a problem with the interpolation technique of FIG. 3.
Figure 7:
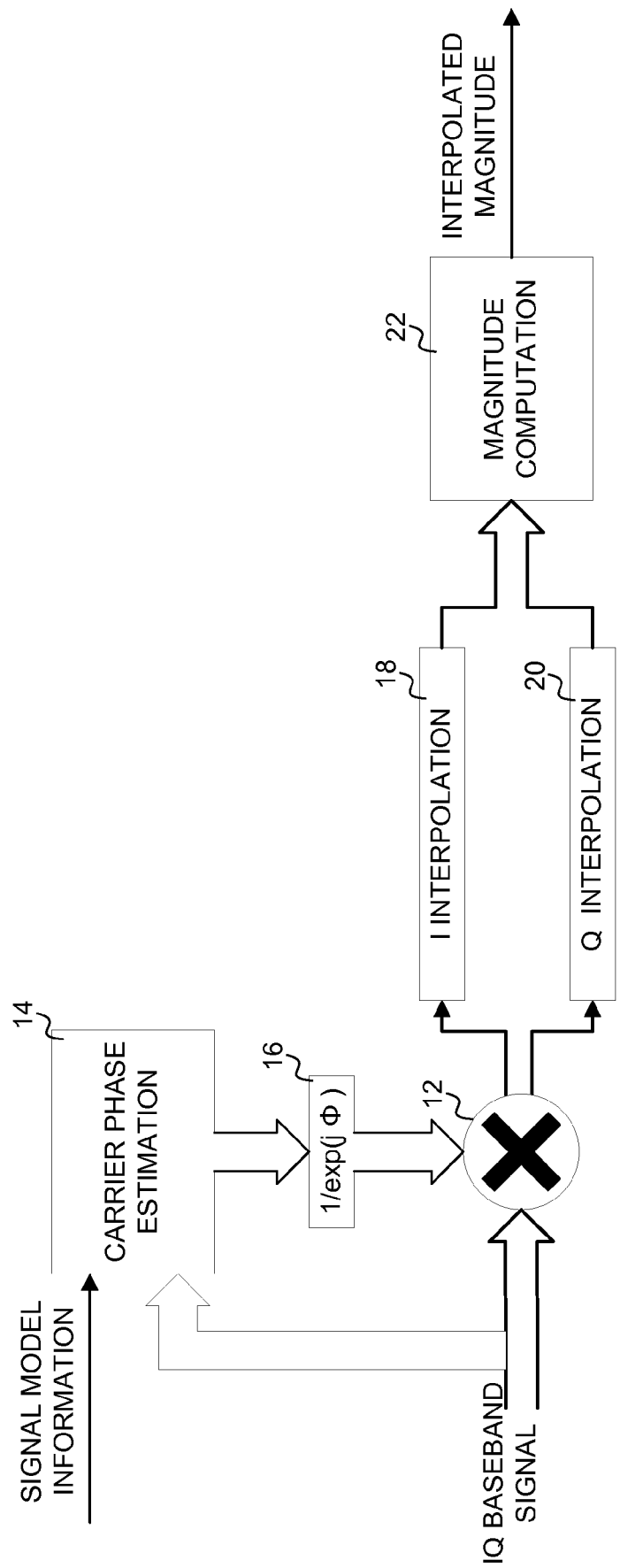
FIG. 7 is a block diagram view of an improved interpolation technique according to the present invention.
Figure 8:
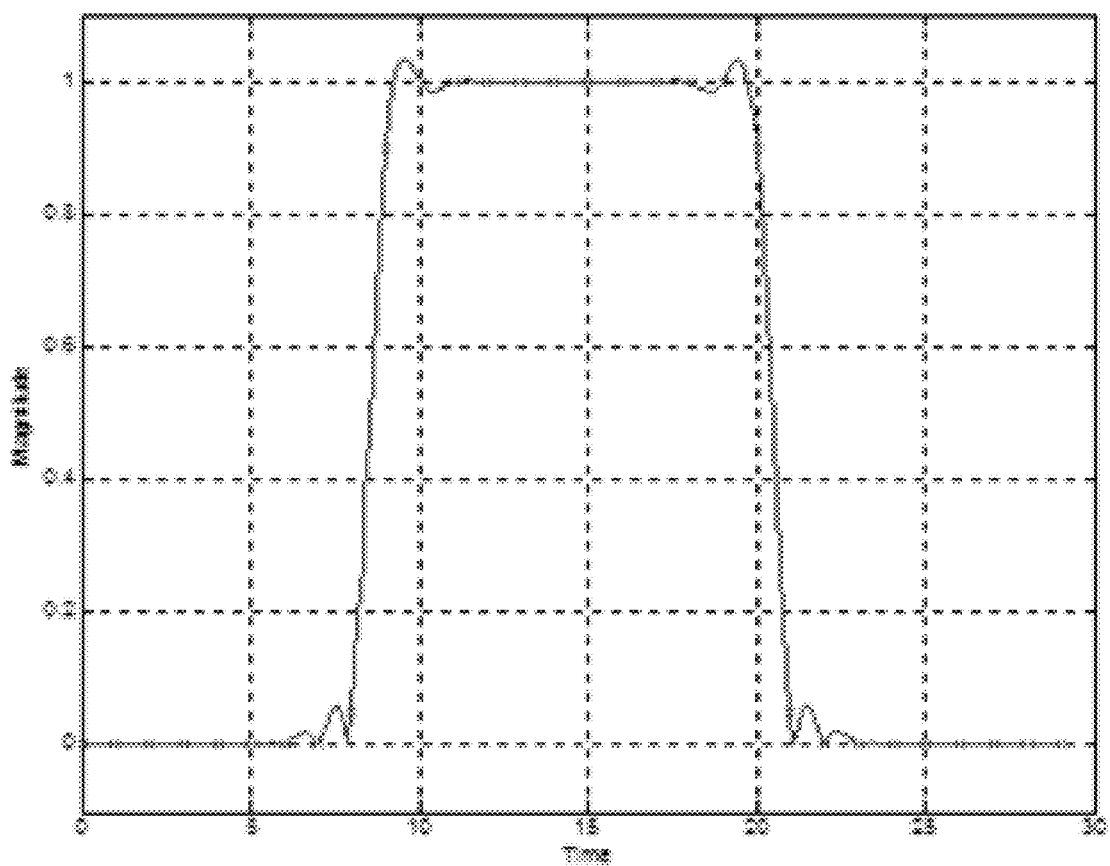
FIG. 8 is a graphic view illustrating a pulsed CW signal produced according to the present invention that does not have the problems of the prior art.

Referring now to FIG. 7 the improved interpolation technique of the present invention is shown, based upon the separate interpolation of the I and Q components of a sampled complex signal. The IQ baseband signal samples produced by a quadrature signal generator from an input sampled signal, as shown in FIG. 1, are input to a compensation module 12 and to a carrier phase estimation module 14. Also input to the carrier phase estimation module 14 is known information about the signal being analyzed in the form of signal model parameters, as described below. The carrier phase estimation module 14 estimates a carrier phase from the IQ baseband signal at each sample time using the signal model parameters. The estimated carrier phase is input to a correction module 16 for generating a correction equation for the IQ baseband signal. Output from the compensation module 12 are corrected I and Q sampled components which are then separately interpolated by respective interpolators 18, 20. The interpolated results are then input to a magnitude computation module 22 to produce the interpolated magnitude samples. The output from the compensation module 12 is corrected so that the sampled signal has no frequency variations. The resulting reconstructed signal is shown in FIG. 8 without any negative magnitudes and with virtually no ripple except at the leading and trailing edges of the CW pulse.

For a signal having a constant envelope, A, such as a CW pulse signal, the complex baseband representation of the signal s(t) may be expressed as:

$$s(t) = A e^{j\phi(t)}$$

The value of $\phi(t)$ is estimated from the sampled signal, s(k), where k is an integer, $t = k t_s$ and $t_s$ is the sampling period. Let $\phi(k)$ be the estimated phase, so the signal phase may be corrected by a sample wise product $$s(k) e^{-\phi(k)}$$

The corrected phase should be almost zero, and the magnitude is exactly the same as the original signal, A. Therefore interpolation independently in I and Q may be safely performed without ripple.

In a CW signal the phase, $\phi(t)$, may be modeled as $$\phi(k) = ak + b$$

where a is the frequency offset and b is the initial phase offset at k=0. Since for this application b is not significant, the frequency offset, a, may be estimated. A common method is the Least Square Estimation (LSE).

For a radar pulse Linear FM (LFM) is commonly used ("chirp" signal), where the phase, $\phi(t)$, may be modeled as $$\phi(k)=ak^2+bk+c$$

and $2a$ is the frequency modulation.

The carrier phase estimation module 14 may use a least squares estimation (LSE), which only requires a signal model, uses simple computation and still provides a reasonable estimation. The principle is to find an estimator, $\hat{\theta}$, that minimizes the sum of error squares, i.e., $$d/d\hat{\theta}_i\{\Sigma(\text{error})^2\}=0$$

where $\theta_1=a$, $\theta_2=b$ and $\theta_3=c$.

The signal model is a linear combination of parameters to be estimated that may be reduced in matrix form to $$y=H\theta+e$$

where y represents the measured phase, e represents the error and $H\theta$ represents the ideal signal $\phi$. The estimator, $\hat{\theta}$, becomes $$\hat{\theta}=(H^TH)^{-1}H^Ty$$

Figure 6:
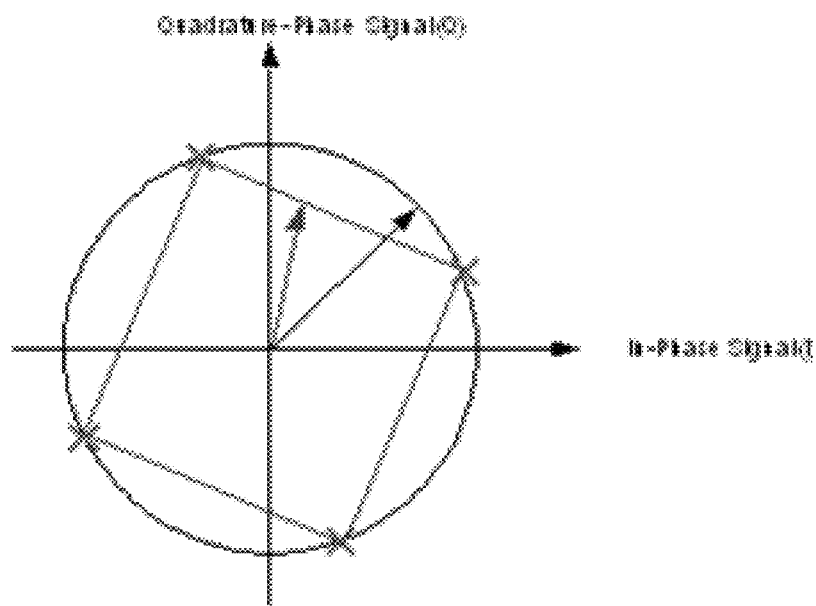
FIG. 6 is a graphic view illustrating the cause of ripple shown in FIG. 5.

At each sample time of the IQ baseband signal a phase sample is determined (see FIG. 6). The LSE is applied to the phase samples to produce the phase estimator which is input to the correction module 16. For a constant frequency signal this is a fit-to-phase measurement—$\phi=at+b+e$—resulting in a linear fit. A fit-to-frequency measurement takes the derivative of the phase over time—$d/dt\{\phi\}=a+e'$—resulting in a constant value. For the LFM signal (varying frequency signal) the two models produce either a parabolic fit—$\phi=at^2+bt+c+e$—or a linear fit—$f=d/dt\{\phi\}=2at+b+e'$.

Other estimator algorithms may be used in lieu of the LSE algorithm. For example another estimator is a Minimum Variance Unbiased Estimator (MVUE). Other classical estimators include Minimum Likelihood Estimator (MLE) among others, and Bayesian estimators include Minimum Mean Squared Error (MMSE), Maximum a Posteriori (MAP), etc.

Therefore the system model is provided to the estimation module 14 in the form of signal model information. If possible the Cramer-Rao Lower Bound (CRLB) is found to access accuracy limits. An estimation algorithm is used on as many raw data points as possible. Other estimators may be used, if possible, and the results for the one having the lowest variance is used.

Thus the present invention provides an improved interpolation for reconstructing sampled complex signals by estimating a carrier phase for the baseband signal from the sampled complex signal and known signal model parameters, and by using the estimated carrier phase to compensate for frequency variation in the sampled complex signal prior to interpolating the complex signal components separately.

What is claimed is:

1. A method of determining interpolated magnitude values derived from sampled data of a complex signal in order to reconstruct the complex signal for display comprising the steps of:
    estimating a carrier phase from the sampled data and known information about the complex signal;
    compensating the sampled data as a function of the estimated carrier phase to produce corrected sampled data; and
    interpolating the corrected sampled data to produce the interpolated magnitude values.

2. The method as recited in claim 1 wherein the interpolating step comprises the steps of:
    interpolating separately each component of the complex signal from the corrected sampled data to produce interpolated component data; and
    computing the interpolated magnitude values from the interpolated component data.

3. An improved method of determining interpolated magnitude values derived from sampled data of a complex signal in order to reconstruct the complex signal for display of the type where components of the complex signal are interpolated from the sampled data to produce interpolated component data and the interpolated magnitude values are computed from the interpolated component data, wherein the improvement comprises the steps of:
    estimating a carrier phase for each sample time of the sampled data using known information about the complex signal; and
    correcting the sampled data using the carrier phase to produce corrected sampled data as the sampled data for interpolation of the components.

4. An apparatus for determining interpolated magnitude values for reconstruction of a complex signal comprising:
    a carrier phase estimator having as inputs sampled data representing the complex signal and known information about the complex signal and providing as an output an estimated carrier phase;
    means for correcting sampled data as a function of the estimated carrier phase to produce corrected sampled data; and
    means for processing the corrected sampled data to produce the interpolated magnitude values.

5. The apparatus as recited in claim 4 wherein the processing means comprises:
    means for interpolating separately components of the complex signal represented by the corrected sampled data to produce interpolated component data; and
    means for computing from the interpolated component data the interpolated magnitude values.

6. An improved apparatus for determining interpolated magnitude values derived from sampled data of a complex signal in order to reconstruct the complex signal for display of the type where the sampled data is interpolated to produce interpolated data and the interpolated magnitude values are calculated from the interpolated data, wherein the improvement comprises:
    a carrier phase estimator having as inputs the sampled data and known information about the complex signal, and producing as an output an estimated carrier phase; and
    means for correcting the sampled data to produce corrected sampled data from which the interpolated data is derived.

* * * * *